(12) United States Patent
Bukchin

(10) Patent No.: US 9,965,831 B2
(45) Date of Patent: May 8, 2018

(54) METHOD AND SYSTEM FOR INTERPOLATING DATA

(71) Applicant: A.A.A TARANIS VISUAL LTD, Tel Aviv (IL)

(72) Inventor: Eli Bukchin, Ramat Gan (IL)

(73) Assignee: A.A.A. TARANIS VISUAL LTD, Tel Aviv (IL)

( * ) Notice: Subject to any disclaimer, the term of this patent is extended or adjusted under 35 U.S.C. 154(b) by 0 days. days.

(21) Appl. No.: 15/525,355

(22) PCT Filed: Sep. 19, 2016

(86) PCT No.: PCT/IB2016/055573
§ 371 (c)(1),
(2) Date: May 9, 2017

(87) PCT Pub. No.: WO2017/051300
PCT Pub. Date: Mar. 30, 2017

(65) Prior Publication Data
US 2017/0337663 A1 Nov. 23, 2017

(30) Foreign Application Priority Data

Sep. 21, 2015 (GB) .................................. 1516670.5

(51) Int. Cl.
*G09G 5/00* (2006.01)
*G06T 3/40* (2006.01)
*G06F 17/16* (2006.01)
*G06F 17/50* (2006.01)

(52) U.S. Cl.
CPC ............ *G06T 3/4007* (2013.01); *G06F 17/16* (2013.01); *G06F 17/5018* (2013.01)

(58) Field of Classification Search
CPC ............................. G06F 17/16; G06F 17/5018
See application file for complete search history.

(56) References Cited

U.S. PATENT DOCUMENTS

| 2009/0234624 A1 | 9/2009 | Yu |
| 2010/0002936 A1 | 1/2010 | Khomo |
| 2010/0321579 A1 | 12/2010 | Ahmad et al. |
| 2015/0245058 A1 | 8/2015 | Alshin et al. |

OTHER PUBLICATIONS

International Search Report dated Jan. 26, 2017.
Written Opinion dated Jan. 26, 2017.

*Primary Examiner* — Phi Hoang
(74) *Attorney, Agent, or Firm* — Symbus Law Group, LLC; Clifford D. Hyra

(57) ABSTRACT

A method and apparatus for interpolating data on a data grid having a plurality of data grid points to provide an interpolated data value at an interpolated point offset from a data grid point by offsets x, y, the method comprising the steps of obtaining a data value and a plurality of derivative values for each of a set of data grid points defining a sub-grid, defining a 4×4 data value matrix from the data values and derivative values, defining a plurality of 4×4 transformation matrices, calculating a 4×4 coefficient matrix from the transformation matrices and the data value matrix, defining a x vector based on the offset x and a y vector based on the offset y, and calculating the interpolated data value from the x vector, y vector and coefficient matrix.

11 Claims, 3 Drawing Sheets

METHOD AND SYSTEM FOR INTERPOLATING DATA

This invention relates to a method and system for interpolating data, preferably within a data grid, example for interpolation of meteorological data.

BACKGROUND TO THE INVENTION

For applications with datasets disposed in a grid, it is often necessary to interpolate the values between the available data points. For example, for meteorological data the data may include elements such as temperature, humidity and pressure, the data points disposed on a grid, and potentially at different altitude levels within the geographical grid. For applications such as weather forecasting, the data is used as an input to simulations, which can then extrapolate likely parameters from the initial dataset. In many cases, however, the scale of the required forecast and hence of the necessary simulation may be at a different scale to that of the original gridded data, and in the circumstances it is necessary to generate interpolated data points, that is additional data points located between the original data points, on a different scale. It is known generate interpolated data points within a data grid using a 16×16 transformation matrix. It will be apparent that the processing associated with doing a matrix algebra using a 16×16 matrix for every required interpolated data point is extremely substantial, and as such a way of reducing the computational load is desirable

SUMMARY OF THE INVENTION

According to a first aspect of the present invention there is provided a method of interpolating data on a data grid having a plurality of data grid points to provide an interpolated data value at an interpolated point offset from a data grid point by offsets x, y, the method comprising the steps of obtaining a data value and a plurality of derivative values for each of a set of data grid points defining a sub-grid, defining a 4×4 data value matrix from the data values and derivative values, defining a plurality of 4×4 transformation matrices, calculating a 4×4 coefficient matrix from the transformation matrices and the data value matrix, defining a x vector based on the offset x and a y vector based on the offset y, and calculating the interpolated data value from the x vector, y vector and coefficient matrix.

The data value matrix may be defined by;

$$IV = \begin{pmatrix} P_{i,j} & P^{x'}_{i,j} & P^{y'}_{i,j} & P^{xy'}_{i,j} \\ P_{i+1,j} & P^{x'}_{i+1,j} & P^{y'}_{i+1,j} & P^{xy'}_{i+1,j} \\ P_{i,j+1} & P^{x'}_{i,j+1} & P^{y'}_{i,j+1} & P^{xy'}_{i,j+1} \\ P_{i+1,j+1} & P^{x'}_{i+1,j+1} & P^{y'}_{i+1,j+1} & P^{xy'}_{i+1,j+1} \end{pmatrix}$$

The plurality of transformation matrices may be defined as;

$$A_{11} = \begin{pmatrix} 1 & 0 & 0 & 0 \\ 0 & 0 & 0 & 0 \\ -3 & 3 & 0 & 0 \\ 2 & -2 & 0 & 0 \end{pmatrix}$$

$$A_{12} = \begin{pmatrix} 0 & 0 & 0 & 0 \\ 1 & 0 & 0 & 0 \\ -2 & -1 & 0 & 0 \\ 1 & 1 & 0 & 0 \end{pmatrix}$$

$$A_{31} = \begin{pmatrix} -3 & 0 & 3 & 0 \\ 0 & 0 & 0 & 0 \\ 9 & -9 & -9 & 9 \\ -6 & 6 & 6 & -6 \end{pmatrix}$$

$$A_{32} = \begin{pmatrix} 0 & 0 & 0 & 0 \\ -3 & 0 & 3 & 0 \\ 6 & 3 & -6 & -3 \\ -3 & -3 & 3 & 3 \end{pmatrix}$$

$$A_{33} = \begin{pmatrix} -2 & 0 & -1 & 0 \\ 0 & 0 & 0 & 0 \\ 6 & -6 & 3 & -3 \\ -4 & 4 & -2 & 2 \end{pmatrix}$$

$$A_{34} = \begin{pmatrix} 0 & 0 & 0 & 0 \\ -2 & 0 & -1 & 0 \\ 4 & 2 & 2 & 1 \\ -2 & -2 & -1 & -1 \end{pmatrix}$$

$$A_{41} = \begin{pmatrix} 2 & 0 & -2 & 0 \\ 0 & 0 & 0 & 0 \\ -6 & 6 & 6 & -6 \\ 4 & -4 & -4 & 4 \end{pmatrix}$$

$$A_{42} = \begin{pmatrix} 0 & 0 & 0 & 0 \\ 2 & 0 & -2 & 0 \\ -4 & -2 & 4 & 2 \\ 2 & 2 & -2 & -2 \end{pmatrix}$$

$$A_{43} = \begin{pmatrix} 1 & 0 & 1 & 0 \\ 0 & 0 & 0 & 0 \\ -3 & 3 & -3 & 3 \\ 2 & -2 & 2 & -2 \end{pmatrix}$$

$$A_{44} = \begin{pmatrix} 0 & 0 & 0 & 0 \\ 1 & 0 & 1 & 0 \\ -2 & -1 & -2 & -1 \\ 1 & 1 & 1 & 1 \end{pmatrix}$$

The x vector may be defined by $$\vec{x} = (1, x, x^2, x^3)$$

and the y vector may be defined by $$\vec{y} = (1, y, y^2, y^3)$$

The coefficient matrix may be calculated from;

$$C^{[1]} = A_{11} IV^{[1]} + A_{12} IV^{[2]}$$

$$C^{[2]} = A_{11} IV^{[3]} + A_{12} IV^{[4]}$$

$$C^{[3]} = A_{31} IV^{[1]} + A_{32} IV^{[2]} + A_{33} IV^{[3]} + A_{34} IV^{[4]}$$

$$C^{[4]} = A_{41} IV^{[1]} + A_{42} IV^{[2]} + A_{43} IV^{[3]} + A_{44} IV^{[4]}$$

The interpolated data value V may be calculated by;

$$V = \vec{y} \cdot (C \cdot \vec{x}^T)$$

At least some of the method steps may be performed using a GPU.

The method may comprise performing the method steps for a plurality of interpolated data points.

The data values may comprise meteorological data.

According to the present invention there is provided a system operable to perform a method according to any one of the preceding claims, the system comprising a GPU operable to run a plurality of shaders to perform at least some of the method steps for each of a plurality of interpolated points.

BRIEF DESCRIPTION OF THE DRAWINGS

An embodiment of the invention is described by way of example only with reference to the accompanying drawings, wherein.

DETAILED DESCRIPTION OF THE PREFERRED EMBODIMENTS

Figure 1:
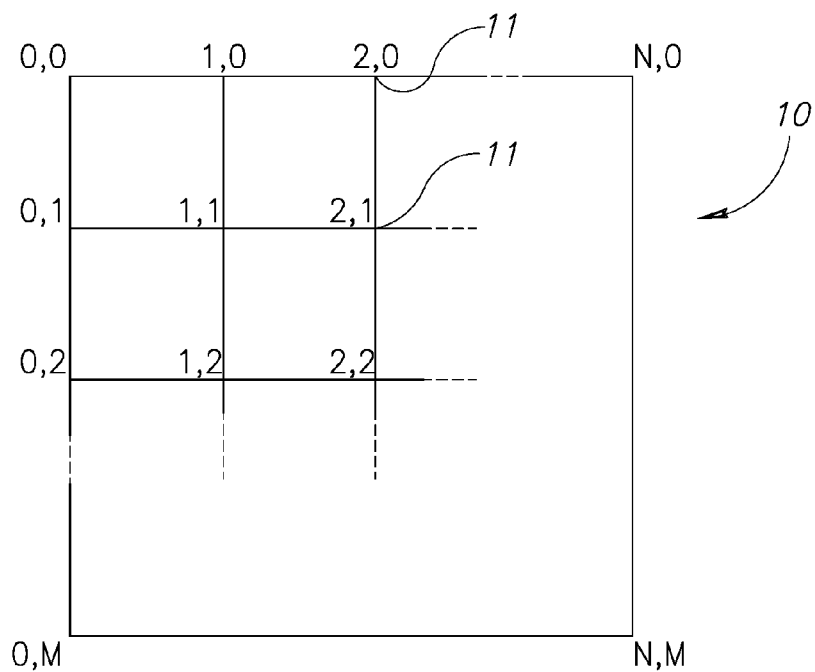
FIG. 1 is an illustration of a data grid.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

Figure 2:
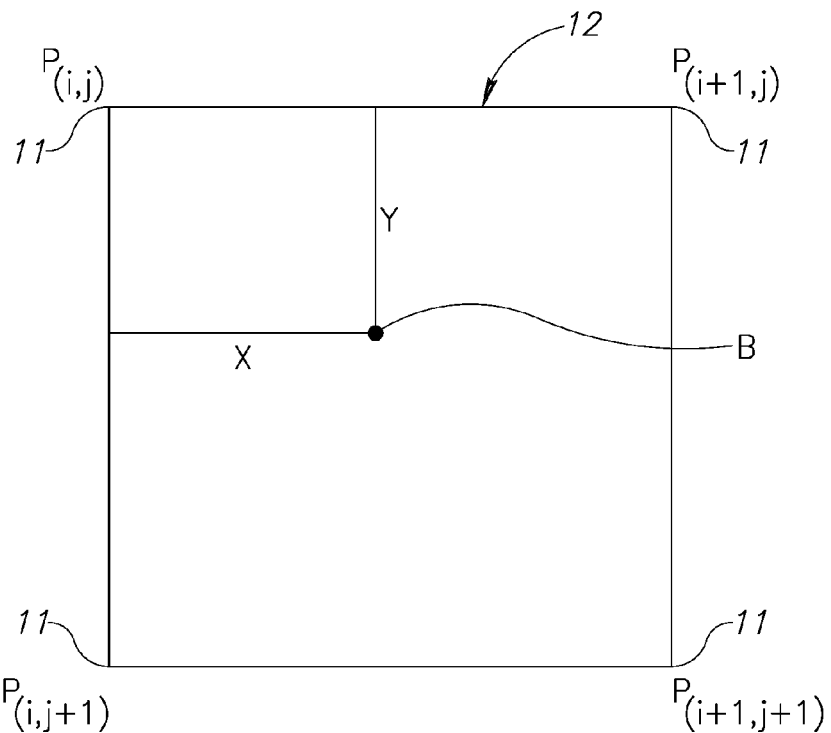
FIG. 2 is an illustration of a point to be interpolated within the data grid of FIG. 1.

Referring to FIGS. 1 and 2, a data grid and a point to be interpolated within the data grid are generally illustrated. The data grid 10 comprises a plurality of data grid points, labelled (0,0) to (N,M), for an array comprising (N+1, M+1) locations. Each data grid point or location within the data grid has one or more associated data values, depending on the type of the data stored. To calculate the interpolated data value at an interpolated point 13 within a single data sub-grid 12 defined by four data grid points shown in FIG. 2, the four date points having associated data values $p_{i,j}$, $p_{i+1,j}$, $p_{i,j+1}$ and $p_{i+1,j+1}$. The interpolated data point is defined by offsets x, y from a selected point within the sub-grid. A plurality of interpolated data points may be calculated within the subgrid 12 but a single point is shown for clarity. Other interpolated data values may similarly be calculated within adjacent sub-girds, depending on the part of the data array over which interpolated values are required.

Prior Art Method

As background, it is desirable to state the known prior art method of interpolating within a data grid.

For each data grid point, four interpolation values are required; the data value $p_{i,j}$, the first order derivative in the x direction $p_{i,j}^{x'}$, the first order derivative in the y direction $p_{i,j}^{y'}$, and a second-order derivative in the x-y direction $p_{i,j}^{xy}$. To calculate an interpolated data value inside a sub-grid the data values and the derivative values for the four enclosing points on the data grid are required.

The first order derivative value at a point one is calculated from the two adjacent points' values;

$$p_{i,j}^{x'} = (p_{i+1,j} - p_{i-1,j}) * 0.5$$

$$p_{i,j}^{y'} = (p_{i,j+1} - p_{i,j-1}) * 0.5$$

When there is no adjacent point, for example at the edge of the data grid, a different approach may be used:

$$p_0^{x'} = (-3*p_0 + 4*p_1 - p_2) * 0.5$$

$$p_N^{x'} = (3*p_N - 4*p_{N-1} + p_{N-2}) * 0.5$$

$$p_0^{y'} = (-3*p_0 + 4*p_1 - p_2) * 0.5$$

$$p_M^{y'} = (3*p_M - 4*p_{M-1} + p_{M-2}) * 0.5$$

For calculating the second order x-y derivative we use:

$$p_{i,j}^{xy} = (p_{i+1,j+1} - p_{i-1,j+1} - p_{i+1,j-1} + p_{i-1,j-1}) * 0.25$$

Similarly, where there are no adjacent data points, at grid points at the corners of the data grid, the derivatives are calculated as follows;

$$p_{0,0}^{xy} = (9p_{0,0} - 12p_{0,1} + 3p_{0,2} - 12p_{1,0} + 16p_{1,1} - 4p_{1,2} + 3p_{2,0} - 4p_{2,1} + p_{2,2}) * 0.25$$

$$p_{N,0}^{xy} = (-9p_{N,0} + 12p_{N,1} - 3p_{N,2} + 12p_{N-1,0} - 16p_{N-1,1} + 4p_{N-1,2} - 3p_{N-2,0} + 4p_{N-2,1} - p_{N-2,2}) * 0.25$$

$$p_{0,M}^{xy} = (-9p_{0,M} + 12p_{0,M-1} - 3p_{0,M-2} + 12p_{1,M} - 16p_{1,M-1} + 4p_{1,M-2} - 3p_{2,M} + 4p_{2,M-1} - p_{2,M-2}) * 0.25$$

$$p_{N,M}^{xy} = (9p_{N,M} - 12p_{N,M-1} + 3p_{N,M-2} - 12p_{N-1,M} + 16p_{N-1,M-1} - 4p_{N-1,M-2} + 3p_{N-2,M} - 4p_{N-2,M-1} + p_{N-2,M-2}) * 0.25$$

For sides:

$$p_{0,j}^{xy} = (-3P_{0,j+1} + 4P_{1,j+1} - P_{2,j+1} + 3P_{0,j-1} - 4P_{1,j-1} + P_{2,j-1})/4$$

$$p_{i,0}^{xy} = (-3P_{i+1,0} + 4P_{i+1,1} - P_{i+1,2} + 3P_{i-1,0} - 4P_{i-1,1} + P_{i-1,2})/4$$

$$p_{N,j}^{xy} = (3P_{N,j+1} - 4P_{N-1,j+1} + P_{N-2,j+1} - 3P_{N,j-1} + 4P_{N-1,j-1} - P_{N-2,j-1})/4$$

$$p_{i,M}^{xy} = (3P_{i+1,M} - 4P_{i+1,M-1} + P_{i+1,M-2} - 3P_{i-1,M} + 4P_{i-1,M-1} - P_{i-1,M-2})/4$$

A 16-element vector is then defined using the data values and calculated derivative values, given by;

$$\overrightarrow{IV_{ij}} = \begin{pmatrix} P_{i,j}, P_{i+1,j}, P_{i,j+1}, P_{i+1,j+1}, P_{i,j}^{x'}, P_{i+1,j}^{x'}, P_{i,j+1}^{x'}, [\ ], P_{i+1,j}^{y'}, \\ P_{i,j+1}^{y'}, P_{i+1,j+1}^{y'}, P_{i,j}^{xy'}, P_{i+1,j}^{xy'}, P_{i,j+1}^{xy'}, P_{i+1,j+1}^{xy'} \end{pmatrix}$$

To generate a coefficient matrix $\vec{C}$, a transformation matrix A is used. The transformation matrix A is a 16×16 matrix given by;

$$A = \begin{bmatrix} 1 & 0 & 0 & 0 & 0 & 0 & 0 & 0 & 0 & 0 & 0 & 0 & 0 & 0 & 0 & 0 \\ 0 & 0 & 0 & 0 & 1 & 0 & 0 & 0 & 0 & 0 & 0 & 0 & 0 & 0 & 0 & 0 \\ -3 & 3 & 0 & 0 & -2 & -1 & 0 & 0 & 0 & 0 & 0 & 0 & 0 & 0 & 0 & 0 \\ 2 & -2 & 0 & 0 & 1 & 1 & 0 & 0 & 0 & 0 & 0 & 0 & 0 & 0 & 0 & 0 \\ 0 & 0 & 0 & 0 & 0 & 0 & 0 & 0 & 1 & 0 & 0 & 0 & 0 & 0 & 0 & 0 \\ 0 & 0 & 0 & 0 & 0 & 0 & 0 & 0 & 0 & 0 & 0 & 0 & 1 & 0 & 0 & 0 \\ 0 & 0 & 0 & 0 & 0 & 0 & 0 & 0 & -3 & 3 & 0 & 0 & -2 & -1 & 0 & 0 \\ 0 & 0 & 0 & 0 & 0 & 0 & 0 & 0 & 2 & -2 & 0 & 0 & 1 & 1 & 0 & 0 \\ -3 & 0 & 3 & 0 & 0 & 0 & 0 & 0 & -2 & 0 & -1 & 0 & 0 & 0 & 0 & 0 \\ 0 & 0 & 0 & 0 & -3 & 0 & 3 & 0 & 0 & 0 & 0 & 0 & -2 & 0 & -1 & 0 \\ 9 & -9 & -9 & 9 & 6 & 3 & -6 & -3 & 6 & -6 & 3 & -3 & 4 & 2 & 2 & 1 \\ -6 & 6 & 6 & -6 & -3 & -3 & 3 & 3 & -4 & 4 & -2 & 2 & -2 & -2 & -1 & -1 \\ 2 & 0 & -2 & 0 & 0 & 0 & 0 & 0 & 1 & 0 & 1 & 0 & 0 & 0 & 0 & 0 \\ 0 & 0 & 0 & 0 & 2 & 0 & -2 & 0 & 0 & 0 & 0 & 0 & 1 & 0 & 1 & 0 \\ -6 & 6 & 6 & -6 & -4 & -2 & 4 & 2 & -3 & 3 & -3 & 3 & -2 & -1 & -2 & -1 \\ 4 & -4 & -4 & 4 & 2 & 2 & -2 & -2 & 2 & -2 & 2 & -2 & 1 & 1 & 1 & 1 \end{bmatrix}$$

The coefficient matrix is given by $\vec{C}=A*\vec{IV}^T$.

A position vector relative to the position of the top left point inside the data grid is given by;

$$\vec{X}=(1,x,x^2,x^3,y,xy,x^2y,x^3y,y^2,xy^2,x^2y^2,x^3y^2,y^3,xy^3,x^2y^3,x^3y^3)$$

Finally, the interpolated data value is the dot product of the two vectors:

$$V=\vec{C}\cdot\vec{X}$$

The operation of multiplying a 16 title vector by a 16×16 matrix is particularly computationally intensive.

Interpolation Method

Figure 3:
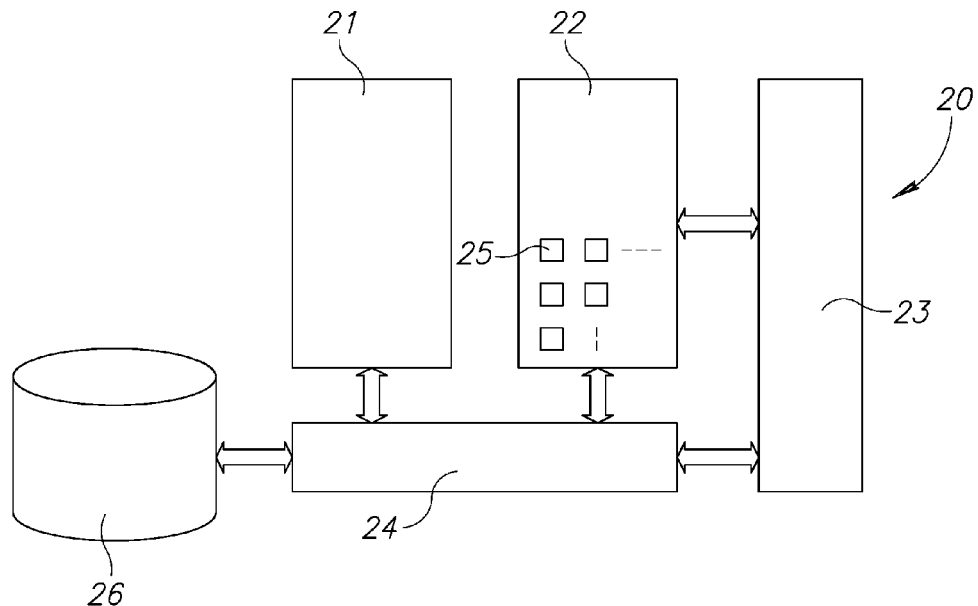
FIG. 3 is an example of a system using a graphics processing unit.

A system of generally known type is illustrated in FIG. 3, at 20. The system comprises a central processor unit (CPU) 21 and a graphics processor unit (GPU) 22 and a memory, for example random access memory, shown at 23. The components are interconnected as shown diagrammatically at 24. This illustration is only an example, and many other alternative arrangements are known, for example with a dedicated block of memory for the GPU, with direct communication between the CPU and GPU, or other structures as required. In known manner, the GPU 22 comprises a plurality of shader cores diagrammatically illustrated at 25, each of which is in effect an independent processor optimised for matrix algebra, originally intended to support image processing. A data store is illustrated at 26, for example to store the complete data array to be interpolated.

During operation of the GPU, programs referred to as shaders are executed by some or all of the shader cores 25 to carry out simultaneous processing of an array of data.

Figure 4:
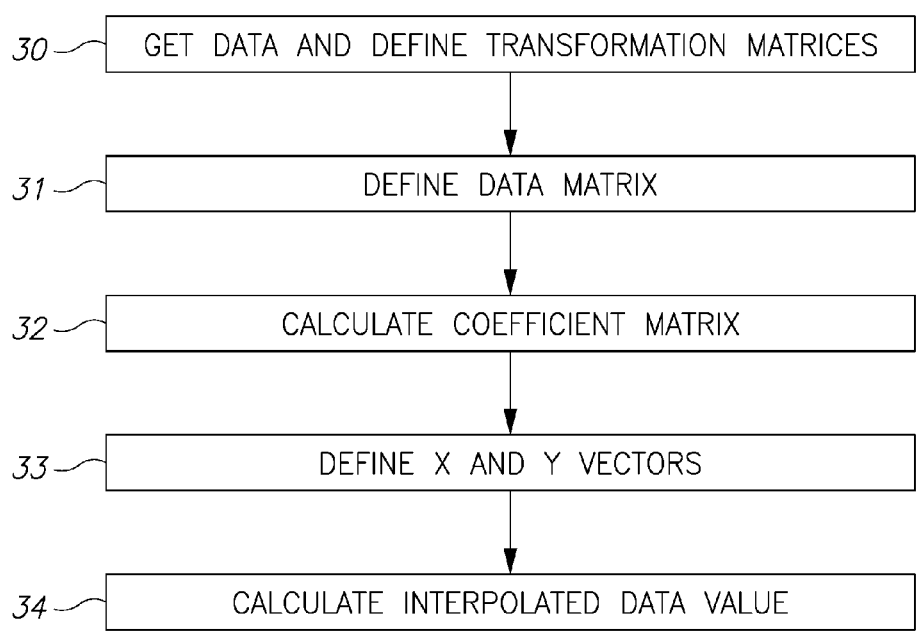
FIG. 4 is a flow diagram illustrating a method according to present invention.

A method of performing interpolation with the system of FIG. 3 will now be described with reference to the diagram of FIG. 4.

At step 30, the data values and derivative values for each data grid point in the part of the data grid of interest are obtained, from the data store 26 or otherwise. The gradient values may be precalculated, that is they may be calculated and stored in such a way that they are associated with the data grid points, prior to carrying out the method described herein, or they may be calculated as part of step 30 on retrieval of the data points.

At step 30, a set of transformation matrices are also defined, based on the transformation matrix defined above. The matrix A is split into 16 4×4 transformation matrices as follows;

$$A = \begin{pmatrix} A_{11} & A_{12} & A_{13} & A_{14} \\ A_{21} & A_{22} & A_{23} & A_{24} \\ A_{31} & A_{32} & A_{33} & A_{34} \\ A_{41} & A_{42} & A_{43} & A_{44} \end{pmatrix}$$

Transformation matrices $A_{13}$, $A_{14}$, $A_{21}$ and $A_{22}$ are zero matrices, $A_{23}=A_{11}$ and $A_{24}=A_{12}$. Accordingly, the method herein uses ten transformation matrices as follows;

$$A_{11} = \begin{pmatrix} 1 & 0 & 0 & 0 \\ 0 & 0 & 0 & 0 \\ -3 & 3 & 0 & 0 \\ 2 & -2 & 0 & 0 \end{pmatrix}$$

$$A_{12} = \begin{pmatrix} 0 & 0 & 0 & 0 \\ 1 & 0 & 0 & 0 \\ -2 & -1 & 0 & 0 \\ 1 & 1 & 0 & 0 \end{pmatrix}$$

$$A_{31} = \begin{pmatrix} -3 & 0 & 3 & 0 \\ 0 & 0 & 0 & 0 \\ 9 & -9 & -9 & 9 \\ -6 & 6 & 6 & -6 \end{pmatrix}$$

$$A_{32} = \begin{pmatrix} 0 & 0 & 0 & 0 \\ -3 & 0 & 3 & 0 \\ 6 & 3 & -6 & -3 \\ -3 & -3 & 3 & 3 \end{pmatrix}$$

-continued $$A_{33} = \begin{pmatrix} -2 & 0 & -1 & 0 \\ 0 & 0 & 0 & 0 \\ 6 & -6 & 3 & -3 \\ -4 & 4 & -2 & 2 \end{pmatrix}$$

$$A_{34} = \begin{pmatrix} 0 & 0 & 0 & 0 \\ -2 & 0 & -1 & 0 \\ 4 & 2 & 2 & 1 \\ -2 & -2 & -1 & -1 \end{pmatrix}$$

$$A_{41} = \begin{pmatrix} 2 & 0 & -2 & 0 \\ 0 & 0 & 0 & 0 \\ -6 & 6 & 6 & -6 \\ 4 & -4 & -4 & 4 \end{pmatrix}$$

$$A_{42} = \begin{pmatrix} 0 & 0 & 0 & 0 \\ 2 & 0 & -2 & 0 \\ -4 & -2 & 4 & 2 \\ 2 & 2 & -2 & -2 \end{pmatrix}$$

$$A_{43} = \begin{pmatrix} 1 & 0 & 1 & 0 \\ 0 & 0 & 0 & 0 \\ -3 & 3 & -3 & 3 \\ 2 & -2 & 2 & -2 \end{pmatrix}$$

$$A_{44} = \begin{pmatrix} 0 & 0 & 0 & 0 \\ 1 & 0 & 1 & 0 \\ -2 & -1 & -2 & -1 \\ 1 & 1 & 1 & 1 \end{pmatrix}$$

At step 31, a 4×4 data value matrix is generated from the data and gradient values. The matrix is arranged as follows;

$$IV = \begin{pmatrix} P_{i,j} & P^{x'}_{i,j} & P^{y'}_{i,j} & P^{xy'}_{i,j} \\ P_{i+1,j} & P^{x'}_{i+1,j} & P^{y'}_{i+1,j} & P^{xy'}_{i+1,j} \\ P_{i,j+1} & P^{x'}_{i,j+1} & P^{y'}_{i,j+1} & P^{xy'}_{i,j+1} \\ P_{i+1,j+1} & P^{x'}_{i+1,j+1} & P^{y'}_{i+1,j+1} & P^{xy'}_{i+1,j+1} \end{pmatrix}$$

It will be apparent that this is the similar to the 16-dimensional vector IV above, reorganized into a 4×4 matrix.

At step 32, a 4×4 coefficient matrix C is calculated using the data value matrix and the relevant transformation matrices. The coefficient matrix is calculated as follows where [ ] denotes column;

$$C^{[1]} = A_{11}IV^{[1]} + A_{12}IV^{[2]}$$

$$C^{[2]} = A_{11}IV^{[3]} + A_{12}IV^{[4]}$$

$$C^{[3]} = A_{31}IV^{[1]} + A_{32}IV^{[2]} + A_{33}IV^{[3]} + A_{34}IV^{[4]}$$

$$C^{[4]} = A_{41}IV^{[1]} + A_{42}IV^{[2]} + A_{43}IV^{[3]} + A_{44}IV^{[4]}$$

It will be apparent that where the calculation is being performed for multiple interpolated points within a sub-grid defined by four data grid points, these steps relate only to the four data values and derivatives and will be the same for each of the multiple interpolated points.

At step 33, position vectors for the interpolated point with offset (x, y) are generated as follows;

$$\vec{x} = (1, x, x^2, x^3)$$

$$\vec{y} = (1, y, y^2, y^3)$$

The interpolated data value V can be calculated from the coefficient matrix and position vectors as follows;

$$V = \vec{y} \cdot (C \cdot \vec{x}^T)$$

Figure 5:
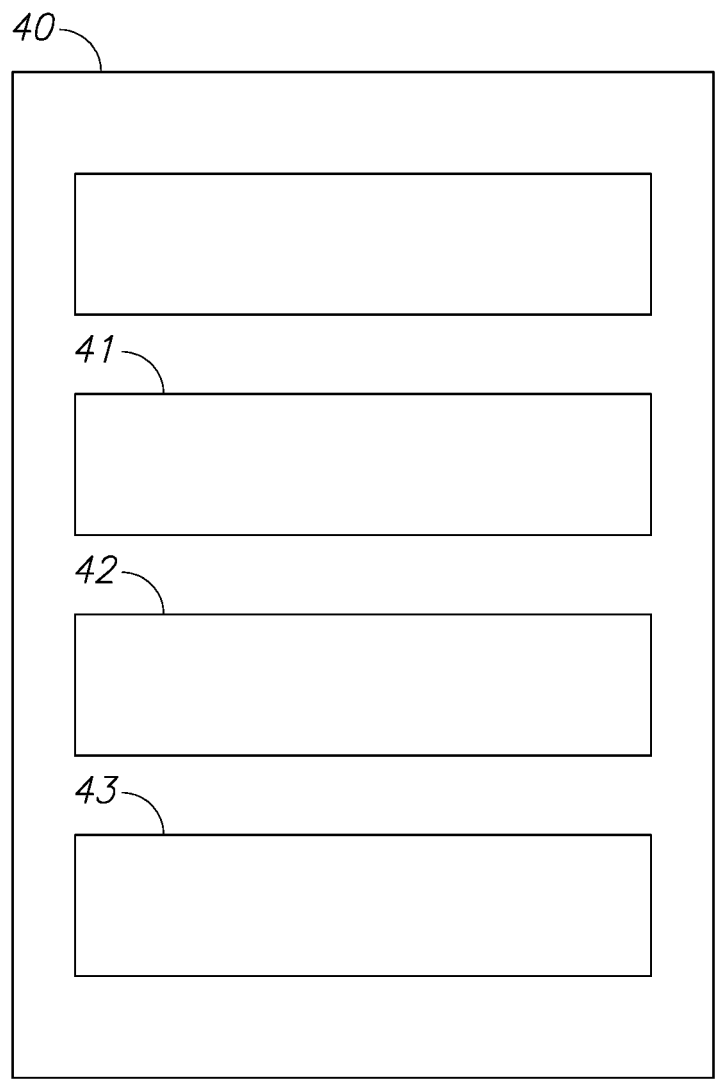
FIG. 5 is an example of a structure of a shader for use in the system of FIG. 3 for performing the method of FIG. 4.

With reference to FIG. 5, a shader is generally shown at 40 in diagrammatic form. In a first component each shader receives the (x, y) offset values, and the data values and derivative values for the 4 data points. The shader comprises a second component 41 in which the A matrices are defined, by a simple declaration of the values of each matrix. A third component 42 calculates coefficient matrix as defined in step 32. As defined at step 33, fourth component 43, the interpolated value is calculated using the given (x, y) offset. The shader 40 will then transmit the interpolated data value into the memory or caches of the GPU 22 in known manner.

As noted, although the shader 40 performs all the steps of 31 to 34 for each interpolated data point, it would be apparent that steps 31 to 33 could instead be performed for each data point in the original grid, and then transferred as part of usual GPU operation to the respective shader 40. The shader 40 would then only perform step 33, the calculation of the interpolated value based on the x,y values for that particular interpolated point. However, depending on the nature of the data, the speed and structure of the GPU, memory access times, and any appropriate factors, it may be faster to perform or steps 31 to 34 within a single shader 40 as illustrated.

Where successive interpolated data points are calculated for the same offset in different data arrays, for example as a part of a time series in successive data arrays, or as a set of data arrays at different altitudes or other spatial offset (for example at different altitudes for meteorological data), linear interpolation can be used to insert additional interpolated data values to provide further finer resolution in the data. This can provide a smooth transition between data with different time stamps, for example. The above method allows to process or present large amounts of, gridded, physical data sets with high performance using less computational power while maintaining the physical integrity of the data. GIS systems such as Google Earth or ESRI's ArcGIS can use this method for displaying rasterized or gridded datasets with seamless zoom and fast sampling capabilities. This method is also useful for speeding up and improving secondary computational passes, utilizing the special separation of each data kernel for parallel computation. The improved interpolation abilities also facilitate for fast and more accurate seaming between spatially shifted data sets or sets with different resolutions.

The method may implemented using any conventional GPU and using any appropriate language, for example HLSL or GLSL.

According, the method is described herein allows for interpolation to be performed efficiently on a GPU, reducing the computational load of known techniques and speeding up the calculation.

In the above description, an embodiment is an example or implementation of the invention. The various appearances of "one embodiment", "an embodiment" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Furthermore, it is to be understood that the invention can be carried out or practiced in various ways and that the invention can be implemented in embodiments other than the ones outlined in the description above.

Meanings of technical and scientific terms used herein are to be commonly understood as by one of ordinary skill in the art to which the invention belongs, unless otherwise defined.

The invention claimed is:

1. A method of estimating a physical characteristic at a geographic location adjacent to at least one geographic location at which a measurement of the physical characteristic was made, measurements of the physical characteristic being represented as data on a data grid having a plurality of data grid points, each data grid point corresponding to a geographic location and each data grid point having a data value representing the physical characteristic at the corresponding geographic location, to provide an interpolated data value at an interpolated point offset from a data grid point by offsets x, y, the method comprising the steps of:

obtaining the data value and a plurality of derivative values for each of a set of data grid points defining a sub-grid, defining a 4×4 data value matrix from the data values and derivative values, defining a plurality of 4×4 transformation matrices, calculating a 4×4 coefficient matrix from the transformation matrices and the data value matrix, defining a x vector based on the offset x and a y vector based on the offset y, and calculating the interpolated data value representing the physical characteristic at the corresponding geographic location from the x vector, y vector and coefficient matrix;

wherein the data value matrix is defined by:
data value matrix $$IV = \begin{pmatrix} P_{i,j} & P_{i,j}^{x'} & P_{i,j}^{y'} & P_{i,j}^{xy'} \\ P_{i+1,j} & P_{i+1,j}^{x'} & P_{i+1,j}^{y'} & P_{i+1,j}^{xy'} \\ P_{i,j+1} & P_{i,j+1}^{x'} & P_{i,j+1}^{y'} & P_{i,j+1}^{xy'} \\ P_{i+1,j+1} & P_{i+1,j+1}^{x'} & P_{i+1,j+1}^{y'} & P_{i+1,j+1}^{xy'} \end{pmatrix},$$

where $P_{i,j}$ is a data value with x,y coordinates in the data grid of i,j, $P_{i,j}^{x'}$ is the first order derivative in the x direction of $P_{i,j}$, $P_{i,j}^{y'}$ is the first order derivative in the y direction of $P_{i,j}$, and $P_{i,j}^{xy'}$ is the second-order derivative in the x-y direction of $P_{i,j}$.

2. A method of estimating a physical characteristic at a geographic location adjacent to at least one geographic location at which a measurement of the physical characteristic was made, measurements of the physical characteristic being represented as data on a data grid having a plurality of data grid points, each data grid point corresponding to a geographic location and each data grid point having a data value representing the physical characteristic at the corresponding geographic location, to provide an interpolated data value at an interpolated point offset from a data grid point by offsets x, y, the method comprising the steps of:

obtaining the data value and a plurality of derivative values for each of a set of data grid points defining a sub-grid, defining a 4×4 data value matrix from the data values and derivative values, defining a plurality of 4×4 transformation matrices, calculating a 4×4 coefficient matrix from the transformation matrices and the data value matrix, defining a x vector based on the offset x and a y vector based on the offset y, and calculating the interpolated data value representing the physical characteristic at the corresponding geographic location from the x vector, y vector and coefficient matrix;

wherein the plurality of transformation matrices are defined by:

$$\text{transformation matrix } A_{11} = \begin{pmatrix} 1 & 0 & 0 & 0 \\ 0 & 0 & 0 & 0 \\ -3 & 3 & 0 & 0 \\ 2 & -2 & 0 & 0 \end{pmatrix}$$

$$\text{transformation matrix } A_{12} = \begin{pmatrix} 0 & 0 & 0 & 0 \\ 1 & 0 & 0 & 0 \\ -2 & -1 & 0 & 0 \\ 1 & 1 & 0 & 0 \end{pmatrix}$$

$$\text{transformation matrix } A_{31} = \begin{pmatrix} -3 & 0 & 3 & 0 \\ 0 & 0 & 0 & 0 \\ 9 & -9 & -9 & 9 \\ -6 & 6 & 6 & -6 \end{pmatrix}$$

$$\text{transformation matrix } A_{32} = \begin{pmatrix} 0 & 0 & 0 & 0 \\ -3 & 0 & 3 & 0 \\ 6 & 3 & -6 & -3 \\ -3 & -3 & 3 & 3 \end{pmatrix}$$

$$\text{transformation matrix } A_{33} = \begin{pmatrix} -2 & 0 & -1 & 0 \\ 0 & 0 & 0 & 0 \\ 6 & -6 & 3 & -3 \\ -4 & 4 & -2 & 2 \end{pmatrix}$$

$$\text{transformation matrix } A_{34} = \begin{pmatrix} 0 & 0 & 0 & 0 \\ -2 & 0 & -1 & 0 \\ 4 & 2 & 2 & 1 \\ -2 & -2 & -1 & -1 \end{pmatrix}$$

$$\text{transformation matrix } A_{41} = \begin{pmatrix} 2 & 0 & -2 & 0 \\ 0 & 0 & 0 & 0 \\ -6 & 6 & 6 & -6 \\ 4 & -4 & -4 & 4 \end{pmatrix}$$

$$\text{transformation matrix } A_{42} = \begin{pmatrix} 0 & 0 & 0 & 0 \\ 2 & 0 & -2 & 0 \\ -4 & -2 & 4 & 2 \\ 2 & 2 & -2 & -2 \end{pmatrix}$$

$$\text{transformation matrix } A_{43} = \begin{pmatrix} 1 & 0 & 1 & 0 \\ 0 & 0 & 0 & 0 \\ -3 & 3 & -3 & 3 \\ 2 & -2 & 2 & -2 \end{pmatrix}$$

$$\text{transformation matrix } A_{44} = \begin{pmatrix} 0 & 0 & 0 & 0 \\ 1 & 0 & 1 & 0 \\ -2 & -1 & -2 & -1 \\ 1 & 1 & 1 & 1 \end{pmatrix}.$$

3. A method according to claim 1 wherein the x vector is defined by $$\text{x vector } \vec{x} = (1, x, x^2, x^3)$$

and the y vector is defined by $$\text{v vector } \vec{y} = (1, y, y^2, y^3).$$

4. A method according to claim 1 wherein the coefficient matrix is calculated from:

$$\text{coefficient matrix } C^{[1]} = A_{11} IV^{[1]} + A_{12} IV^{[2]}$$

$$\text{coefficient matrix } C^{[2]} = A_{11} IV^{[3]} + A_{12} IV^{[4]}$$

$$\text{coefficient matrix } C^{[3]} = A_{31} IV^{[1]} + A_{32} IV^{[2]} + A_{33} IV^{[3]} + A_{34} IV^{[4]}$$

$$\text{coefficient matrix } C^{[4]} = A_{41} IV^{[1]} + A_{42} IV^{[2]} + A_{43} IV^{[3]} + A_{44} IV^{[4]}.$$

5. A method according to claim 1 wherein the interpolated data value V is calculated by:

$$V = \vec{y} \cdot (C \cdot \vec{x}^T)$$

where $\vec{y}$ is the y vector, C is a coefficient matrix, and $\vec{x}^T$ is a transpose of the x vector.

6. A method according to claim 1 wherein at least some of the method steps are performed using GPU.

7. A method according to claim 1 comprising performing the method for a plurality of interpolated data points.

8. A method according to claim 1 wherein the data values comprise meteorological data.

9. A system operable to perform a method according to claim 1, the system comprising a GPU programmed to run a plurality of shaders to perform at least some of the method steps for each of a plurality of interpolated points.

10. A method according to claim 1, the data values comprising GIS data and the data grid being displayed on an electronic display, wherein the interpolated data value is provided in response to an instruction to zoom in on the display and the interpolated data value is used to display the data grid at a higher zoom and corresponding higher resolution.

11. A method according to claim 1, wherein the physical characteristic comprises a meteorological characteristic, further comprising forecasting weather at a geographic location in between geographic locations where measured meteorological data is available using the interpolated data value.

* * * * *